US009543914B2

(12) United States Patent
Bouny

(10) Patent No.: US 9,543,914 B2
(45) Date of Patent: Jan. 10, 2017

(54) DOHERTY AMPLIFIER STRUCTURE

(71) Applicant: Ampleon Netherlands B.V., Nijmegen (NL)

(72) Inventor: Jean-Jacques Bouny, Fontenilles (FR)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/511,307

(22) Filed: Oct. 10, 2014

(65) Prior Publication Data

US 2015/0119107 A1    Apr. 30, 2015

(30) Foreign Application Priority Data

Oct. 31, 2013   (EP) ..................................... 13290266

(51) Int. Cl.
*H03F 3/68* (2006.01)
*H03F 1/56* (2006.01)
(Continued)

(52) U.S. Cl.
CPC .............. *H03F 3/68* (2013.01); *H03F 1/0288* (2013.01); *H03F 1/56* (2013.01); *H03F 3/245* (2013.01);
(Continued)

(58) Field of Classification Search
CPC combination set(s) only.
See application file for complete search history.

(56) References Cited

U.S. PATENT DOCUMENTS 6,737,922 B2 * 5/2004 Pengelly ............... H03F 1/0277
330/124 R
7,939,864 B1    5/2011 Blednov
(Continued)

FOREIGN PATENT DOCUMENTS

EP          2 393 112 A2    12/2011
WO     2006/006119 A1     1/2006
(Continued)

OTHER PUBLICATIONS

Extended European Search Report for Application No. 13290266.9 (Mar. 14, 2014).

*Primary Examiner* — Kabir A Timory
(74) *Attorney, Agent, or Firm* — McDonnell Boehnen Hulbert & Berghoff LLP

(57) ABSTRACT

An integrated Doherty amplifier structure comprising;
  a main amplifier stage;
  at least one peak amplifier stage;
  an output combination bar configured to receive and combine an output from both the main amplifier stage and the or each peak amplifier stage;
  a main connection configured to connect an output of the main amplifier stage to the combination bar, the main connection comprising, at least in part, a bond wire forming a first inductance;
  a peak connection configured to connect an output of the peak amplifier stage to the combination bar;
  wherein the main connection connects to the combination bar at a first point along the bar and the peak connection connects to the combination bar at a second point along the bar spaced from the first point and the main amplifier stage is located further from the output combination bar than the at least one peak amplifier stage.

15 Claims, 2 Drawing Sheets

(51) Int. Cl.
*H04W 88/08* (2009.01)
*H03F 1/02* (2006.01)
*H03F 3/24* (2006.01)

(52) U.S. Cl.
CPC ..... *H04W 88/08* (2013.01); *H01L 2224/49111* (2013.01); *H01L 2224/49171* (2013.01); *H01L 2224/49175* (2013.01); *H03F 2203/21139* (2013.01); *H03F 2203/21142* (2013.01)

(56) References Cited

U.S. PATENT DOCUMENTS

| | | | |
|---|---|---|---|
| 2005/0231278 A1* | 10/2005 | Blednov | H01L 24/49 330/124 R |
| 2011/0140786 A1* | 6/2011 | Blednov | 330/295 |
| 2011/0279178 A1* | 11/2011 | Outaleb et al. | 330/124 R |
| 2012/0126890 A1* | 5/2012 | Svechtarov | 330/124 R |

FOREIGN PATENT DOCUMENTS

| | | |
|---|---|---|
| WO | 2007/119208 A2 | 10/2007 |
| WO | 2008/062371 A2 | 5/2008 |

\* cited by examiner

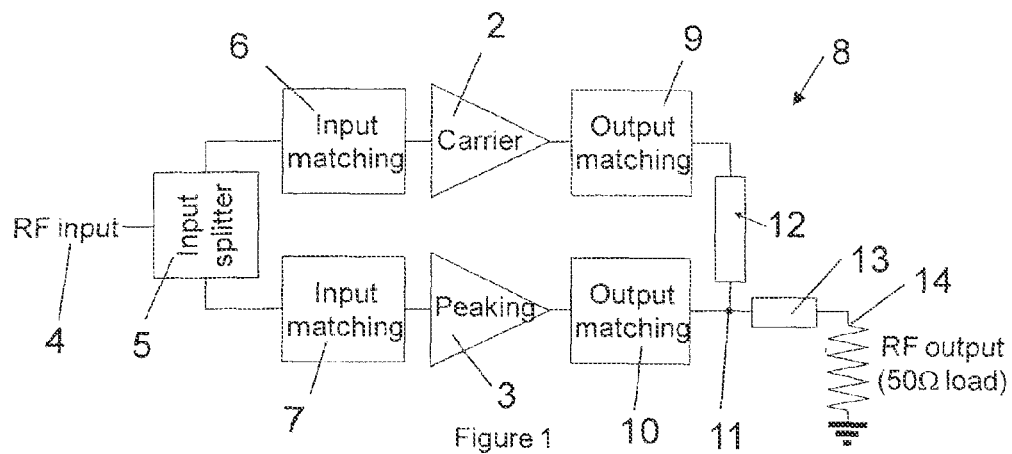
Fig. 1
PRIOR ART
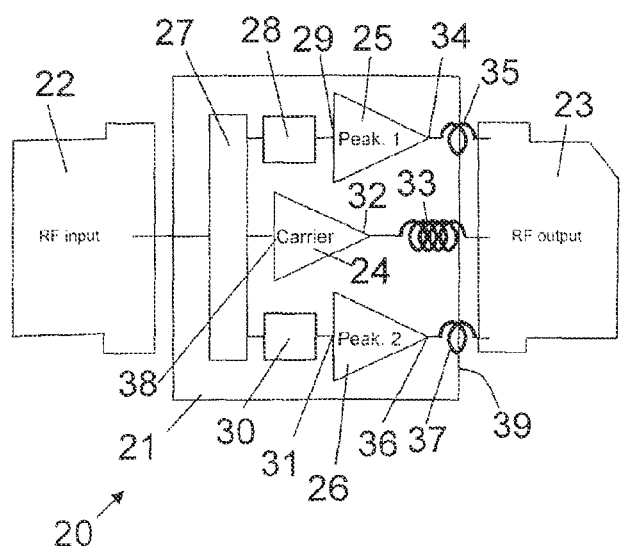
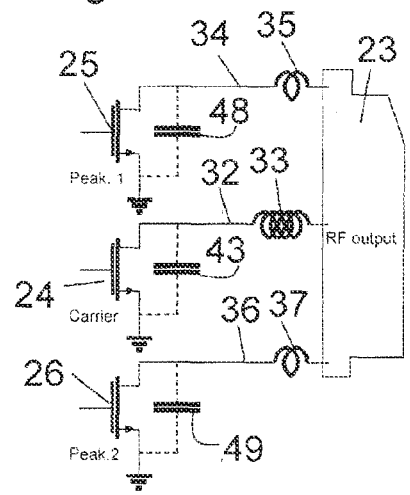

DOHERTY AMPLIFIER STRUCTURE

CROSS-REFERENCE TO RELATED APPLICATIONS

This application claims the priority under 35 U.S.C. §119 of European patent application no. 13290266.9, filed on Oct. 31, 2013, the contents of which are incorporated by reference herein.

This invention relates to a Doherty amplifier structure. Further, the invention relates to an integrated circuit package incorporating said amplifier. It also relates to a power amplifier and a cellular base station including said power amplifier.

Doherty amplifiers are a type of amplifier that can be used for radio frequency amplification. Doherty amplifiers have found particular application in the field of mobile telecommunications and are used in the amplification of signals in GSM, WCDMA and LTE mobile telecommunication networks. A general layout of a known Doherty amplifier 1 is shown in FIG. 1 which comprises a first amplifier 2 known as the main amplifier and one or more second amplifiers 3 (only one second amplifier shown in FIG. 1) known as the peak amplifiers arranged in parallel. The main and peak amplifiers are typically formed of transistors which are biased differently such that, at low power, only the main amplifier amplifies an input signal 4, and at higher power all of the amplifiers 2, 3 operate together. The Doherty amplifier layout 1 also includes an input splitter 5 that splits the input signal 4 for supply to the main and peak amplifiers 2, 3. Each of the main and peak amplifiers 2, 3 are associated with an input impedance matching element 6, 7 through which the input signals from the splitter 5 pass prior to receipt by the main and peak amplifiers 2, 3. The input matching elements 6, 7 comprise a network of capacitive and inductive elements. The output from the main amplifier 2 and peak amplifier 3 is received by respective impedance matching elements 9 and 10. The output of the main and peak amplifiers 2, 3 after passing through the impedance matching elements 9, 10 are combined, at a combination point 11, through an impedance inverter 12, which comprises a quarter wave transmission line. The combination of matching elements 9 and 10 and the impedance inverter 12 is provided to improve efficiency at back-off, that is at reduced power levels than those of a fully operating state, such as when only the main amplifier is active. The combined signal passes through an impedance matching element 13, which provides a transformation from the impedance of the amplifier arrangement to the load 14.

Doherty amplifiers are simple to manufacture but, due to the electrical length of the impedance inverter 8 and matching elements 6, 7, 9 and 10 and the quarter wave transmission line 12, they can suffer from bandwidth limitations. Further, the matching networks take up space on a printed circuit board implementation of a Doherty amplifier and also require complex tuning.

According to a first aspect of the invention we provide an integrated Doherty amplifier structure comprising;
a main amplifier stage;
at least one peak amplifier stage;
an output combination bar configured to receive and combine an output from both the main amplifier stage and the or each peak amplifier stage;
a main connection configured to connect an output of the main amplifier stage to the combination bar, the main connection comprising, at least in part, a bond wire forming a first inductance;
a peak connection configured to connect an output of the peak amplifier stage to the combination bar;
wherein the main connection connects to the combination bar at a first point along the bar and the peak connection connects to the combination bar at a second point along the bar spaced from the first point and the main amplifier stage is located further from the output combination bar than the at least one peak amplifier stage.

This is advantageous as positioning the main amplifier further from the point at which the amplifier output signals are combined provides space on an integrated circuit die for forming an impedance inversion arrangement between the output of the amplifier stages and the combination bar. Thus, due to the position of the main amplifier relative to the peak amplifier the bond wire that forms the main connection can be longer and have a greater electrical length compared to the peak connection. This provides a convenient basis for forming an impedance inversion arrangement at the output of the amplifier stages (i.e. a Doherty combiner).

The first inductance of the main connection in combination with an output capacitance of the main and peak amplifier stages may form, at least in part, an impedance inversion arrangement for the main amplifier stage. Thus, the inductance due to the use of the bond wires between the output of the main amplifier stage and the combination bar can be used in combination with the output capacitance of the amplifier stages to form an appropriate impedance inversion arrangement. With appropriate selection/tuning of the capacitances and inductances the arrangement between the output of the amplifier stages and the combination bar introduces a 90° phase shift between a load (at the output lead) and a current source of the main amplifier stage at an operating frequency. Thus, the arrangement may behave as a PI filter. The arrangement can therefore provide the impedance inversion necessary to achieve high gain and high efficiency.

The output capacitances of each peak amplifier stage and the output capacitance of the main amplifier stage may comprise or include parasitic capacitances, such as Drain-Source capacitance in the case a MOSFET is used as the amplifier stages. Alternatively, an integrated capacitance may be provided between the output of each of the amplifier stages and ground. The output capacitance may include a package capacitance comprising a capacitance formed between the amplifier stages and a package in which the integrated Doherty amplifier structure is mounted.

The main amplifier stage and at least one peak amplifier stage may be formed on a die. The output combination bar may comprise an output lead of a package in which the semiconductor die is mounted. This arrangement is advantageous as the main connection and the peak connection may be provided by bond wires to said output lead which provides the required connections and also forms an impedance inversion arrangement. In particular, the electrical length of the bond wires that provide the connection to the output lead can be used to form, together with the Cds, capacitances of the amplifier stages, a PI network that forms an impedance inverter arrangement. Thus, the bond wires may connect the output of the amplifier stages to an edge of the output lead facing the die.

Alternatively, the combination bar may comprise a bar extending along the die. The combination bar may be aligned with an edge of the die. Bond wires may be used to connect the combination bar on the die to the output lead of the package.

The combination bar may have a width equal to or greater than the total width of the amplifier stages that form the amplifier structure. Thus, if the combination bar comprises the output lead of the package in which the Doherty amplifier structure is mounted, the output lead may be wide enough to receive the main and peak connections. Thus, the width of the combination bar may extend in a direction perpendicular to the direction in which the main and peak connections extend. This improves the ease of manufacture as the bond wires that may form the main and peak connections all extend in the same direction parallel to one another and meet the combination bar at spaced apart locations along its width.

The integrated Doherty amplifier structure may include a first peak amplifier stage and second peak amplifier stage, the first peak amplifier stage connected to the output lead by a first peak connection and the second peak amplifier stage connected to the output lead by a second peak connection. The first and second peak connections may therefore connect to the combination bar at spaced apart locations along its width. The main amplifier stage may be located between the first and second peak amplifier stages. This may improve the symmetry of the output of the amplifiers.

The impedance inversion arrangement may be configured to be tuned by way of the length of the main connection relative to the length of the peak connection. Therefore the present arrangement is advantageous as there may only be a single critical inductance (the bond wire of the main connection) for tuning the impedance inversion arrangement.

The main connection may extend between an output bond pad of the main amplifier stage and connect directly to the combination bar. Thus, the main connection may solely comprise a bond wire that does not connect through any other phase shifting components as it extends to the combination bar.

The peak connection may extend between an output bond pad of the peak amplifier stage and connect directly to the combination bar. Thus, the peak connection may solely comprise a bond wire that does not connect through any other phase shifting components as it extends to the combination bar. Preferably, the output bond pad of the peak amplifier stage is located adjacent an output edge of a die on which the Doherty amplifier structure is formed and the output bond pad of the main amplifier stage is spaced from said output edge. This is advantageous as any phase shift caused by the peak connection will be small while the phase shift in the main connection, by virtue of its position, can be greater, such that a phase shift of +90° in the main amplifier output relative to the peak amplifier output can be achieved between the output from the amplifier stages and the combination bar at the operating frequency.

The output lead may be connected to a load impedance matching network formed outside of said package for impedance matching to a load. Providing the load impedance matching network outside the package enables more efficient use of the space on the die.

The main and peak amplifier stages may be provided by field effect transistors and the peak connection connects a drain of the peak amplifier stage directly to the output lead and the main connection connects a drain of the main amplifier stage directly to the output lead.

The structure may include a phase compensation element connected between an input to the structure and the at least one peak amplifier stage for compensating for a phase difference between the output of the main amplifier and the output of the or each peak amplifier at the combination bar at an operating frequency.

The output of the main amplifier stage may comprise a main output bond pad and the main connection, comprising a bond wire, connects the main output bond pad directly to the combination bar; and the output of the or each peak amplifier stage may comprise a peak output bond pad and the peak connection, comprising a bond wire, connects the peak output bond pad directly to the combination bar. These direct connections obviate the need for phase shifting components (other than the bond wires themselves) between the output of the amplifier stages and the point where the outputs are combined.

The structure may include an integrated input splitting element configured to receive an input signal to the Doherty amplifier structure and split said signal to said main and at least one peak amplifier stages. Thus, the input splitting element may be formed on the same die as the amplifier stages. Further, the phase compensation network may be integrated on die. Alternatively, the phase compensation network and or input splitting element may not be integrated components.

The main amplifier stage may be formed of at least one transistor of class AB bias and/or the peak amplifier stage is formed of at least one transistor of class C bias.

According to a second aspect of the invention we provide an integrated circuit package including the integrated Doherty amplifier structure of the first aspect of the invention.

An output lead of the package may form the combination bar. It will be appreciated that the optional features of the first aspect of the invention apply equally to the second aspect of the invention.

According to a third aspect of the invention, we provide a power amplifier including the Doherty amplifier structure of the first aspect of the invention.

According to a third aspect of the invention, we provide a cellular base station for a mobile telecommunications network including the Doherty amplifier structure of the first aspect of the invention.

The arrangement described herein has a wide bandwidth using the main and peak connections and combination bar to form an efficient impedance inversion and power combining arrangement, while providing a cost effective structure for manufacture. The impedance inversion arrangement provides a wideband power amplifier combiner at back-off (i.e. reduced) power levels. In other words, when operating a power levels lower than those of a fully operating state, without compromising any bandwidth at full power levels.

BRIEF DESCRIPTION OF THE DRAWINGS

There now follows, by way of example only, a detailed description of embodiments of the invention with reference to the following figures, in which:

FIG. 1 shows a prior art general layout of a Doherty amplifier;

FIG. 2 shows a schematic diagram of an example of the Doherty amplifier structure of the present invention;

FIG. 3 shows a circuit diagram corresponding to the schematic diagram of FIG. 2;

FIGS. 2, 3 and 4 shows a Doherty amplifier structure 20 that is formed as an integrated circuit on a die 21. An input lead 22, which may form part of a package 40 (shown in FIG. 4), in which the die 21 is mounted, supplies an input signal to the Doherty amplifier structure 20. The input signal, in this example, comprises a RF signal for amplification by the Doherty amplifier structure 20. An output lead 23, which may also form part of the package 40 in which the die 21 is mounted, comprises an output for an output signal that has been amplified by the Doherty amplifier structure 20.

Figure 4:
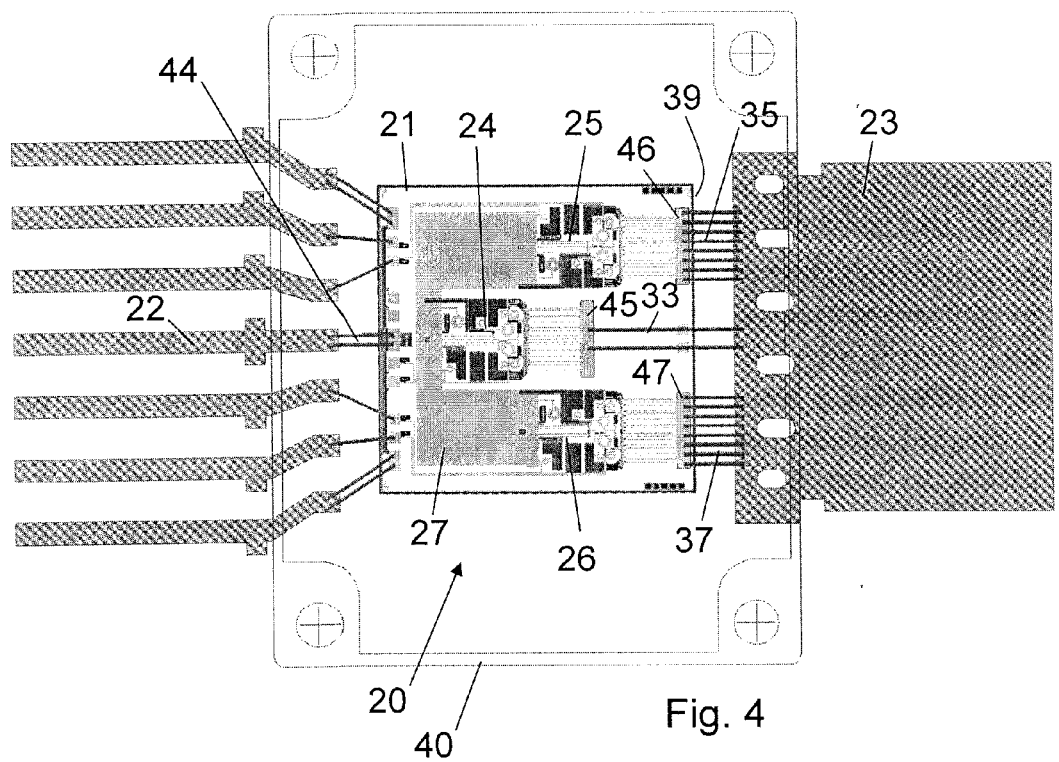
FIG. 4 shows a diagram of an example of the structure formed on a die, in an integrated circuit package.

The integrated Doherty amplifier structure 20 comprises a main amplifier stage 24 that is connected in parallel with, in this embodiment, two peak amplifier stages. The two peak amplifier stages comprise a first peak amplifier stage 25 and a second peak amplifier stage 26 arranged either side of the main amplifier stage 24 on the die 21. This arrangement provides symmetry to the power flow through the structure. The first and second peak amplifier stages are configured to receive an input signal that is phase delayed with respect to the input signal received by the main amplifier stage 24, as will be discussed in more detail below. The main and peak amplifier stages are provided by field effect transistors and thus have source, gate and drain connections. In the present embodiment, the main and peak amplifier stages comprise cascaded stage amplifiers including a driver transistor and an output transistor. It will be appreciated that the main stage and peak stages may comprise a cascaded arrangement of transistors or not.

An input splitting element 27 is configured to split the input signal from the input lead 22 to the main, first peak and second peak amplifier stages 24, 25 and 26. The input splitting element 27 comprises an integrated element on the die 21 and receives the input signal via a bond wire 44.

The main amplifier stage 24 receives an input signal directly from the input splitting element 27. A first, integrated, phase compensation element 28 receives the signal from the input splitting element 27 and provides a phase shifted signal to a gate 29 of the first peak amplifier stage 25. A second, integrated, phase compensation element 30 receives the signal from the input splitting element 27 and provides a phase shifted signal to the gate 31 of the second peak amplifier stage 26. The phase compensation elements 28 and 30 may be implemented in any known manner, such as an appropriate network of capacitances and inductances. The phase compensation elements 28, 30 compensate for phase delays between the output of the main and peak amplifier stages caused by an impedance inversion arrangement, as will be described in more detail below.

The output lead 23 is arranged to receive an output from the main amplifier stage 24, the first peak amplifier stage 25 and the second peak amplifier stage 26. The output lead 25 forms a combination bar in the structure 20. The output 32 of the main amplifier stage 24 is connected to the output lead 23 by a main connection 33, formed by a bond wire. The output 34 of the first peak amplifier stage 25 is connected to the output lead 23 by a first peak connection 35, formed by a bond wire. The output 36 of the second peak amplifier stage 26 is connected to the output lead 23 by a second peak connection 37, formed by a bond wire. The physical length and electrical length of the main connection 33 is greater than the physical and electrical length of each of the two peaking connections 35 and 37. The combination bar has a width and is orientated such relative to the main and peak amplifier stages that the main and peak connection bond wires can be constructed parallel to one another and combine at the combination bar at spaced locations along its width. In particular, the combination bar extends perpendicular to the bond wires that attach to it. In this embodiment, the combination bar comprises the edge of the output lead 23.

The different lengths of the main connection 33 compared to the peak connections 35, 37 in combination with capacitances of the main and peak amplifier stages 24, 25, 26 form an impedance inverter arrangement. The impedance inversion arrangement is tuned such that the output from the main amplifier stage 24 can be efficiently received at the output lead 23 when only the main amplifier stage is operating and the output of the main and peak amplifier stages can be efficiently received and combined at the output lead 23.

The impedance inversion arrangement introduces a 90° phase shift in the output of the main amplifier stage 24 and therefore the phase compensation elements 28 and 30 are adapted to compensate for this phase shift. Accordingly, the output from the main amplifier 24 and the peak amplifiers 25, 26, when operating together, at high power, are combined at the output lead 23 in phase. The peak connections 35, 37 are preferably short and therefore the output of the first and second peak amplifiers are located adjacent the die edge so that the bond wires that connect the output from the peak amplifiers to the output lead are short and introduce a small, preferably minimal, phase shift.

The input lead 22 is connected to the input splitting element 27 on the die 21 by one or more bond wires 44. Further input leads may be present to connect the die 21 to other inputs required by the Doherty amplifier structure, such as to provide a gate bias and drain bias, for the main and peak amplifier stages 24, 25, 26. Such inputs will be known to those skilled in the art.

The main amplifier stage 24 in this example comprises a dual cascaded stage amplifier having bias class AB. The first and second peak amplifier stages 25 and 26 in this example comprise dual cascaded stage amplifiers having bias class C. The main amplifier 24 receives the input signal from the splitting element 27 at its input 38 via an integrated path. Likewise, the respective input 29 and 31 of the first and second peak amplifiers 25, 26 receive the phase delayed input signal from the phase compensation elements 28, 30 via an integrated path.

As shown in FIGS. 2 and 4, the main amplifier stage is physically located further from the output lead 23 than the first and second peak amplifier transistors on the die. The output lead 23 is parallel with an "output edge" 39 of the die, i.e, the side of the rectangular die at which the output of the structure 20 is received. In particular, the output 32 of the main amplifier transistor 24 comprises a drain of the transistor. The drain includes a drain bond pad marked 45 (in FIG. 4) which comprises the physical position of the output 32. The output 34 of the first peak amplifier transistor 25 comprises a drain of the transistor and the drain includes a drain bond pad marked as 46 in FIG. 4. The output 36 of the second peak amplifier transistor 26 comprises a drain of the transistor and the drain includes a drain bond pad marked as 47 in FIG. 4. The drain bond pad 45 of the main amplifier transistor 24 is located further from the die edge 39, and therefore the output lead 23, than the drain bond pads 46 and 47 of the first and second peak amplifier transistors 25, 26.

The main connection 33 is provided by a bond wire, in particular a pair of bond wires as shown in FIG. 4. The bond wire 33 is connected directly between the drain bond pad output 32 and the output lead 23 without a discrete impedance matching network therebetween. The bond wire 33 extends over the die surface to intermediate bond pads 41 and 42 located at the die edge 39 and then on to the output lead 23. The intermediate bond pads 41 and 42 provide support for the bond wire 33 and do not act to connect the bond wire to a further component. The first peak connection 35 is also provided by a set of bond wires that extend from the drain bond pad output 34, located adjacent the die edge 39, directly to the output lead 23 without a discrete impedance matching network therebetween. Likewise the second peak connection 37 is also provided by a set of bond wires that extend from the drain bond pad output 36, located adjacent the die edge 39, directly to the output lead 23 without a discrete impedance matching network therebetween.

The position of the main transistor stage 24 in the die 21 relative to the peak amplifier stages 25, 26 enables a longer bond wire 33 to be used. With reference to FIG. 3, given that the intermediate bond pads 41, 42 are located at the die edge aligned with the drain bond pads 34 and 36, it is the length of the part of the bond wire 33 that extends between the drain bond pad 32 and the intermediate bond pads 41, 42 that provides a relative difference in inductance in the connections 33, 37, 38.

The use of the longer bond wire between the main amplifier stage and the combination point at the output lead is advantageous because the larger inductance of the main bond wire can be used in part to form an impedance inversion arrangement. In particular, at low power, when only the main amplifier structure 24 is operating and the peak amplifier stages 25, 26 are inactive, the first and second peak amplifier stages 25 and 26 act as capacitors connected to the output lead 23. Thus, with an appropriate choice of the length of the main connection 33, an output capacitance 43 of the main amplifier 24, the inductance of the main connection 33, and the output capacitance 48, 49 (parasitic Cds capacitance) presented by the peaking amplifier stages 25 and 26, the arrangement between the amplifier stages 24, 25, 26 and the output lead 23 (of lumped capacitances and inductances) behaves as a "PI" filter which provides the required impedance inversion for efficient operation.

When the main and peak amplifier stages 24, 25, 26 are operating together, the longer electrical length of the main connection 33 introduces a 90 degree phase shift to the amplified output of the main amplifier stage. However, given that a phase delay is introduced to the signal received by the first and second peak amplifiers 25 and 26 by the phase compensation elements 28 and 30, the signals from the main and peak amplifier stages are in phase at the point of combination, which comprises the output lead 23 of the package. Further, the main connection 33 comprises the only part of the Doherty amplifier structure 20 that may need to be tuned, particularly when the phase compensation elements are integrated. This makes operation of the Doherty amplifier structure 20 simple to use and manufacture.

The above described embodiment achieves high levels of integration as the Doherty amplifier structure can be formed on a die in which the input splitting element is integrated, the phase compensation network is integrated, the amplifier stages are integrated and the impedance inversion network is formed, in part, by bond wires that also provide the connection from the die to an output lead. The locating of the main amplifier stage further from the output lead than the peak amplifier stage provides the space for the main connection bond wire to extend parallel to the peak connection bond wire while having the electrical length to implement an impedance inversion arrangement between the amplifier stages and the output lead. As the bond wires comprise the only non-integrated part of the impedance inversion arrangement, the Doherty amplifier structure is reliable to manufacture and easy to tune.

An output impedance matching network (not shown) may be provided on a PCB on which a package containing the Doherty amplifier structure 20 is mounted, to transform the optimum impedance of the Doherty amplifier structure 20 to an impedance for a load (not shown).

In an alternative embodiment, not shown, the combination bar may be formed on the die and bond wires may connect the combination bar to the output lead 23. In particular, the combination bar may extend linearly between the output bond pads 46, 47 of the peak amplifier stages and the main connection 33 may connect to the combination bar at a point between the output bond pads 46, 47.

Figure 5:
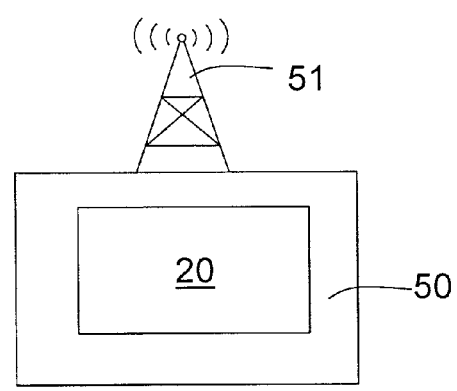
FIG. 5 shows a cellular base station of a mobile telecommunication network incorporating the Doherty amplifier structure.

FIG. 5 shows a cellular base station 50 of a mobile telecommunication network incorporating the Doherty amplifier structure 20. The Doherty amplifier structure 20 is used to amplify a signal used to drive the antenna 51.

The invention claimed is:

1. An integrated Doherty amplifier structure comprising;
   a main amplifier stage;
   a first peak amplifier stage;
   an output combination bar configured to receive and combine an output from the main amplifier stage and an output from the first peak amplifier stage, wherein the main amplifier stage and the first peak amplifier stage are formed on a semiconductor die and the output combination bar comprises an output lead of a package in which the semiconductor die is mounted;
   a main connection configured to connect the output of the main amplifier stage to the output combination bar, the main connection comprising, at least in part, a bond wire forming a first inductance;
   a peak connection configured to connect the output of the first peak amplifier stage to the output combination bar; wherein the main connection connects to the output combination bar at a first point along the output combination bar, the peak connection connects to the output combination bar at a second point along the output combination bar spaced from the first point, the main amplifier stage is located further from the output combination bar than the first peak amplifier stage, and a physical and electrical length of the main connection is greater than a physical and electrical length of the peak connection.

2. The integrated Doherty amplifier structure as defined in claim 1, wherein the first inductance of the main connection in combination with an output capacitance of the main amplifier stage and the first peak amplifier stage form, at least in part, an impedance inversion arrangement for the main amplifier stage.

3. The integrated Doherty amplifier structure as defined in claim 2, wherein the impedance inversion arrangement is configured to be tuned by way of a length of the main connection relative to a length of the peak connection.

4. The integrated Doherty amplifier structure as defined in claim 1, wherein the output combination bar has a width equal to or greater than a total width of the amplifier stages that form the integrated Doherty amplifier structure.

5. The integrated Doherty amplifier structure as defined claim 1, further comprising:
   a second peak amplifier stage, wherein the first peak amplifier stage is connected to an output lead by a first peak connection and the second peak amplifier stage is connected to the output lead by a second peak connection.

6. The integrated Doherty amplifier structure as defined in claim 1, wherein the main connection is provided by a bond wire that extends between an output bond pad of the main amplifier stage and connects directly to the output combination bar.

7. The integrated Doherty amplifier structure as defined in claim 1, wherein the output lead is connected to an output impedance matching network formed outside of said package for impedance matching to a load.

8. The integrated Doherty amplifier structure as defined in claim 1, wherein the main and first peak amplifier stages are provided by field effect transistors, the peak connection connects a drain of the first peak amplifier stage directly to an output lead, and the main connection connects a drain of the main amplifier stage directly to the output lead.

9. The integrated Doherty amplifier structure as defined in claim 1, further comprising:
a phase compensation element connected between an input to the integrated Doherty amplifier structure and the first peak amplifier stage configured to compensate for a phase difference between the output of the main amplifier stage and the output of the first peak amplifier stage at the output combination bar.

10. The integrated Doherty amplifier structure as defined in claim 1, wherein the output of the main amplifier stage comprises a main output bond pad, and the main connection, comprising a first bond wire, connects the main output bond pad directly to the output combination bar; the output of the first peak amplifier stage comprises a peak output bond pad, and the peak connection, comprising a second bond wire, connects the peak output bond pad directly to the output combination bar, the first bond wire have a greater length than the second bond wire.

11. The integrated Doherty amplifier structure as defined in claim 1, further comprising:
an integrated input splitting element configured to receive an input signal to the integrated Doherty amplifier structure and split said signal to said main and first peak amplifier stages.

12. The integrated Doherty amplifier structure as defined in claim 1, wherein the main amplifier stage is formed of at least one transistor of class AB bias and the first peak amplifier stage is formed of at least one transistor of class C bias.

13. A power amplifier including the integrated Doherty amplifier structure of claim 1.

14. A cellular base station for a mobile telecommunications network including the power amplifier structure of claim 13.

15. The integrated Doherty amplifier structure of claim 2, wherein the impedance inversion arrangement introduces a 90° phase shift in the output of the main amplifier stage.

\* \* \* \* \*